(12) United States Patent
Hon (10) Patent No.: US 11,108,304 B2
(45) Date of Patent: Aug. 31, 2021

(54) BRUSHLESS MOTOR ASSEMBLY

(71) Applicant: MOBILETRON ELECTRONICS CO., LTD., Taichung (TW)

(72) Inventor: Wen-Shing Hon, Taichung (TW)

(73) Assignee: MOBILETRON ELECTRONICS CO., LTD., Taichung (TW)

( * ) Notice: Subject to any disclaimer, the term of this patent is extended or adjusted under 35 U.S.C. 154(b) by 69 days.

(21) Appl. No.: 16/420,872

(22) Filed: May 23, 2019

(65) Prior Publication Data
US 2019/0379258 A1  Dec. 12, 2019

(30) Foreign Application Priority Data

Jun. 7, 2018 (TW) ................... 107119679

(51) Int. Cl.
*H02K 9/22* (2006.01)
*H02K 7/14* (2006.01)
(Continued)

(52) U.S. Cl.
CPC ............... *H02K 9/22* (2013.01); *H02K 7/145* (2013.01); *H02K 9/06* (2013.01); *H02K 11/33* (2016.01);
(Continued)

(58) Field of Classification Search
CPC .. H02K 5/00; H02K 5/04; H02K 7/00; H02K 7/14; H02K 7/145; H02K 9/00;
(Continued)

(56) References Cited

U.S. PATENT DOCUMENTS 5,006,744 A * 4/1991 Archer ................... H02K 29/06
310/58
6,175,171 B1 * 1/2001 Rupp ....................... H02K 5/18
165/80.3
(Continued)

FOREIGN PATENT DOCUMENTS

CN 101815874 A 8/2010
CN 103153754 A 6/2013
(Continued)

OTHER PUBLICATIONS

Examination Report for TW107119679, dated Dec. 10, 2019, Total of 3 pages.
(Continued)

*Primary Examiner* — Tran N Nguyen
(74) *Attorney, Agent, or Firm* — Tracy M Helms; Apex Jurls, Pllc.

(57) ABSTRACT

A brushless motor assembly includes a motor body, a circuit board, and a heat sink. The circuit board has a mounting surface and includes a motor control unit and a power switch which are disposed on the mounting surface. The motor control unit is adapted to control an operation of the power switch. The heat sink is disposed between the motor body and the circuit board, wherein the heat sink has a first side portion and a second side portion which are opposite to each other; the first side portion faces the motor body, and the second side portion faces the circuit board and shields the mounting surface of the circuit board. With the aforemen- (Continued)

tioned design, it could effectively protect the electronic components on the circuit board and provide good heat dissipation effect.

6 Claims, 6 Drawing Sheets

(51) Int. Cl.
*H02K 9/06* (2006.01)
*H02K 11/33* (2016.01)
*H05K 1/18* (2006.01)
*H05K 1/02* (2006.01)
*H05K 7/20* (2006.01)
*B25F 5/02* (2006.01)

(52) U.S. Cl.
CPC ........... *H05K 1/0203* (2013.01); *H05K 1/181* (2013.01); *H05K 7/209* (2013.01); *B25F 5/02* (2013.01); *H02K 2211/03* (2013.01); *H05K 2201/066* (2013.01); *H05K 2201/10053* (2013.01)

(58) Field of Classification Search
CPC . H02K 9/06; H02K 9/22; H02K 11/00; H02K 11/30; H02K 11/33; H05K 7/00; H05K 7/20; H05K 7/209; H05K 1/00; H05K 1/0203; H05K 1/0209; H05K 1/181; B25F 5/00; B25F 5/008; H01L 23/00; H01L 23/36; H01L 23/37; H01L 23/373; F04D 25/00; F04D 25/28; F04D 29/00; F04D 29/58
See application file for complete search history.

(56) References Cited

U.S. PATENT DOCUMENTS

| 2013/0088128 A1* | 4/2013 | Nakano | H05K 7/2039 310/68 R |
| 2013/0187484 A1 | 7/2013 | Liu et al. | |
| 2014/0035445 A1* | 2/2014 | Uryu | H02K 11/33 310/68 D |

FOREIGN PATENT DOCUMENTS

| CN | 103580387 A | 2/2014 |
| TW | 545798 U | 8/2003 |
| TW | 200740085 A | 10/2007 |
| TW | 201203814 A | 1/2012 |

OTHER PUBLICATIONS

Search Report for TW107119679, dated Dec. 10, 2019, Total of 1 page.
English Abstract for CN101815874, Total of 1 page.
English Abstract for TW545798, Total of 1 page.
English Abstract for TW200740085, Total of 1 page.
English Abstract for TW201203814, Total of 1 page.
Search report for CN201810642502.2, dated Feb. 5, 2021, Total of 1 page.
English abstract for CN103153754, Total of 1 page.
English abstract for CN103580387, Total of 1 page.

* cited by examiner

BRUSHLESS MOTOR ASSEMBLY

BACKGROUND OF THE INVENTION

Technical Field

The present invention relates generally to a brushless motor, and more particularly, to a brushless motor assembly.

Description of Related Art

Nowadays, most of the electric-driven machines and the electric tools include a permanent magnet brushless DC motor (BLDCM) as a power motor. The permanent magnet DC brushless motor is adopted because the permanent magnet brushless motor has a higher torque-to-moment-of-inertia ratio and is without the drawbacks of the non-permanent magnet brushless DC motor, such as brush wear, commutation sparking, excessive noise, etc.

However, the conventional structural design of the DC brushless motors is not good enough, which makes it not easy to assemble, disassemble and repair the DC brushless motors. In addition, the electronic components on the circuit boards of the DC brushless motors are usually exposed to the outside and are easily damaged or short-circuited due to collisions with other components of the DC brushless motors. Therefore, it still needs to improve the structural design of the DC brushless motors.

BRIEF SUMMARY OF THE INVENTION

In view of the above, an object of the present invention is to provide a brushless motor assembly which could effectively protect electronic components on a circuit board.

According to the present invention, a brushless motor assembly includes a motor body, a circuit board, and a heat sink. Wherein, the circuit board has a mounting surface and includes a motor control unit and a power switch which are disposed on the mounting surface. The motor control unit is adapted to control an operation of the power switch. The heat sink is disposed between the motor body and the circuit board, wherein the heat sink has a first side portion and a second side portion which are opposite to each other; the first side portion faces the motor body, and the second side portion faces the circuit board and shields the mounting surface of the circuit board.

With the above design, the brushless motor assembly of the present invention not only could use the heat sink to dissipate heat from the motor control unit and the power switch on the circuit board, but also could use the heat sink as a support to fix the circuit board to the motor body, thereby effectively utilizing an assembly space of the motor. In addition, by shielding or enclosing the mounting surface of the circuit board with the heat sink, it could further isolate and protect the electronic components on the protection circuit board.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

The following illustrative embodiments and drawings are provided to illustrate the disclosure of the present invention, these and other advantages and effects can be clearly understood by persons skilled in the art after reading the disclosure of this specification. Referring to FIGS. 1 to 5, a brushless motor assembly 100 according to an embodiment of the present invention includes a motor body 1, a circuit board 10, and a heat sink 20.

Figure 6:
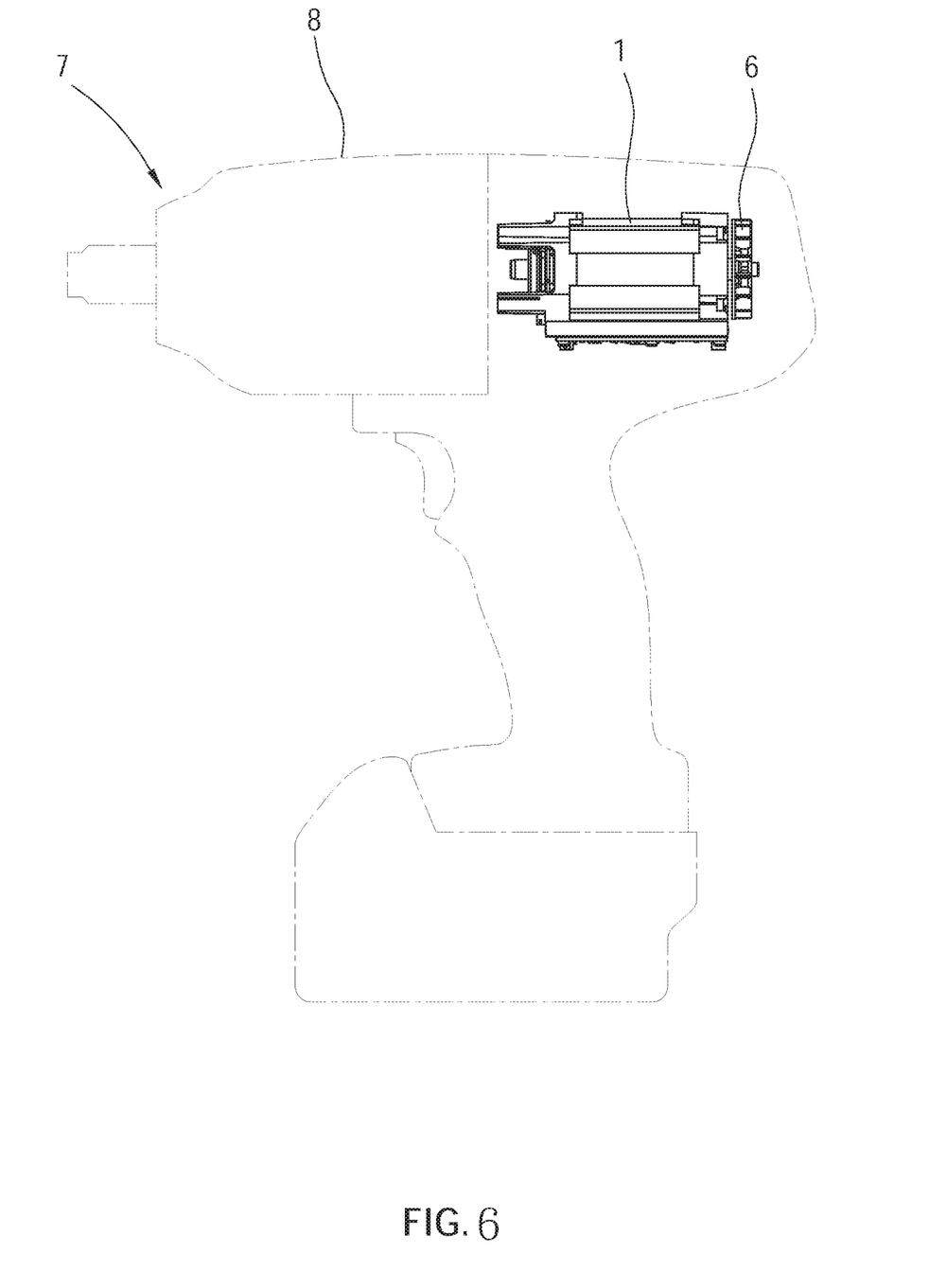
FIG. 6 is a schematic view showing that the brushless motor assembly of the aforementioned embodiment is disposed within an electric tool.

The motor body 1 is a DC brushless motor as an example and includes a stator core 2, a front cover 3, a rear cover 4, a rotary shaft 5, and a fan 6. The front cover 3 and the rear cover 4 are respectively connected to a front side and a rear side of the stator core 2. The rotary shaft 5 is inserted into the stator core 2 and the two ends of the rotary shaft 5 pass through the front cover 3 and the rear cover 4 respectively. The fan 6 is disposed on the rotary shaft 5 and could be rotated by the rotary shaft 5 to provide airflow for heat dissipation and cooling. In practice, the motor body 1 could be applied to an electric tool 7 (as shown in FIG. 6) and be disposed in a housing 8 of the electric tool 7. The rotary shaft 5 is adapted to be connected to a tool head, wherein the tool head could be a drill bit, a screwdriver bit, a wire saw bit, or other types of tool heads, however, this is not a limitation of the present invention. Whereby, when the motor body 1 is driven to control the rotation of the rotary shaft 5, the connected tool head would be driven to rotate, vibrate or perform other types of operation.

The circuit board 10 includes a mounting surface 10a on which electronic components are disposed. For example, in the current embodiment, the electronic components include a motor control unit 12 and at least one power switch 14, wherein the motor control unit 12 could be a microcontroller, and the power switch 14 could be a Metal-Oxide-Semiconductor Field-Effect Transistor (MOSFET), however, this is not a limitation of the present invention. The motor control unit 12 is adapted to control an operation of the power switch 14, such as being turned on and off, which further drives actuation of the motor body 1.

The heat sink 20 is disposed between the motor body 1 and the circuit board 10. The heat sink 20 could include a material of graphite, ceramics, aluminum, etc., however, this is not a limitation of the present invention. In addition, the heat sink 20 also could be made of other materials with high thermal conductivity. The heat sink 20 has a first side portion 20a and a second side portion 20b which are opposite to each other, wherein the first side portion 20a faces the motor body 1 and is adapted to be connected to the motor body 1, and preferably, the first side portion 20a of the heat sink 20 is connected to the front cover 3 and the rear cover 4 of the motor body 1 respectively, and is apart from the stator core 2 of the motor body 1 with a gap G; the second side portion 20b faces the circuit board 10, and is adapted to shield and cover, or even enclose the mounting surface 10a of the circuit board 10 such that the electronic components such as the motor control unit 12 and the power switch 14 on the mounting surface 10a of the circuit board 10 would not be exposed in the housing 8 of the electric tool 7.

Figure 1:
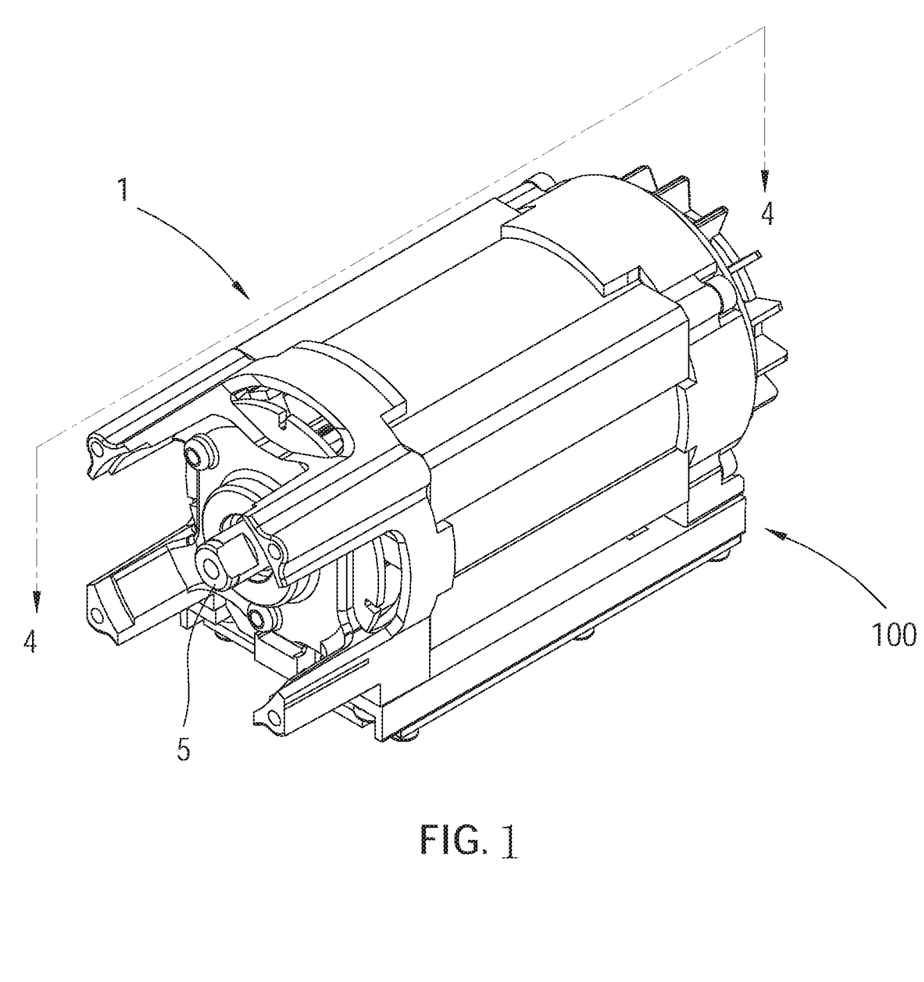
FIG. 1 is a perspective view of a brushless motor assembly according to an embodiment of the present invention.
Figure 2:
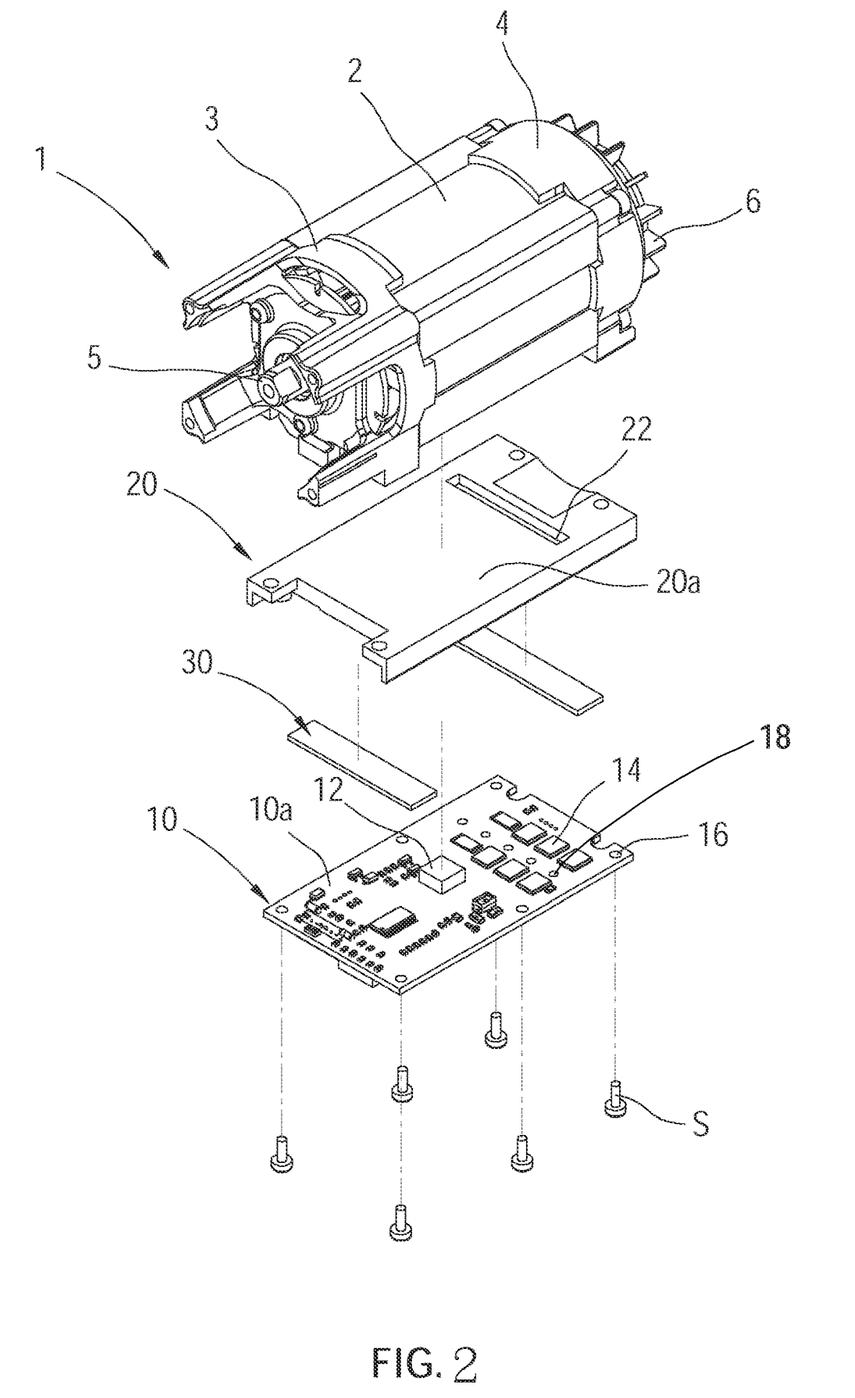
FIG. 2 is an exploded view of the brushless motor assembly according to the aforementioned embodiment.
Figure 3:
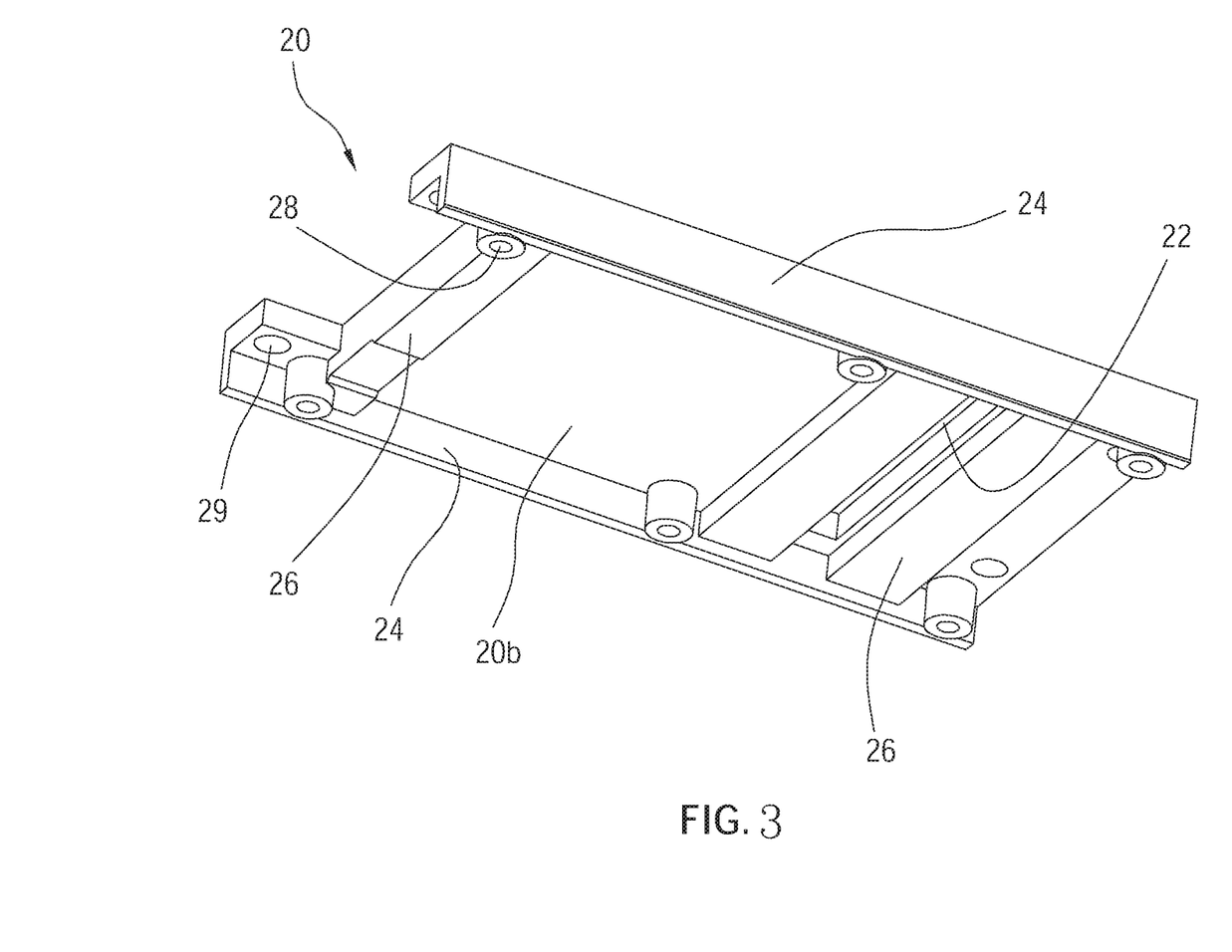
FIG. 3 is a perspective view of the heat sink according to the aforementioned embodiment from another angle of view.
Figure 4:
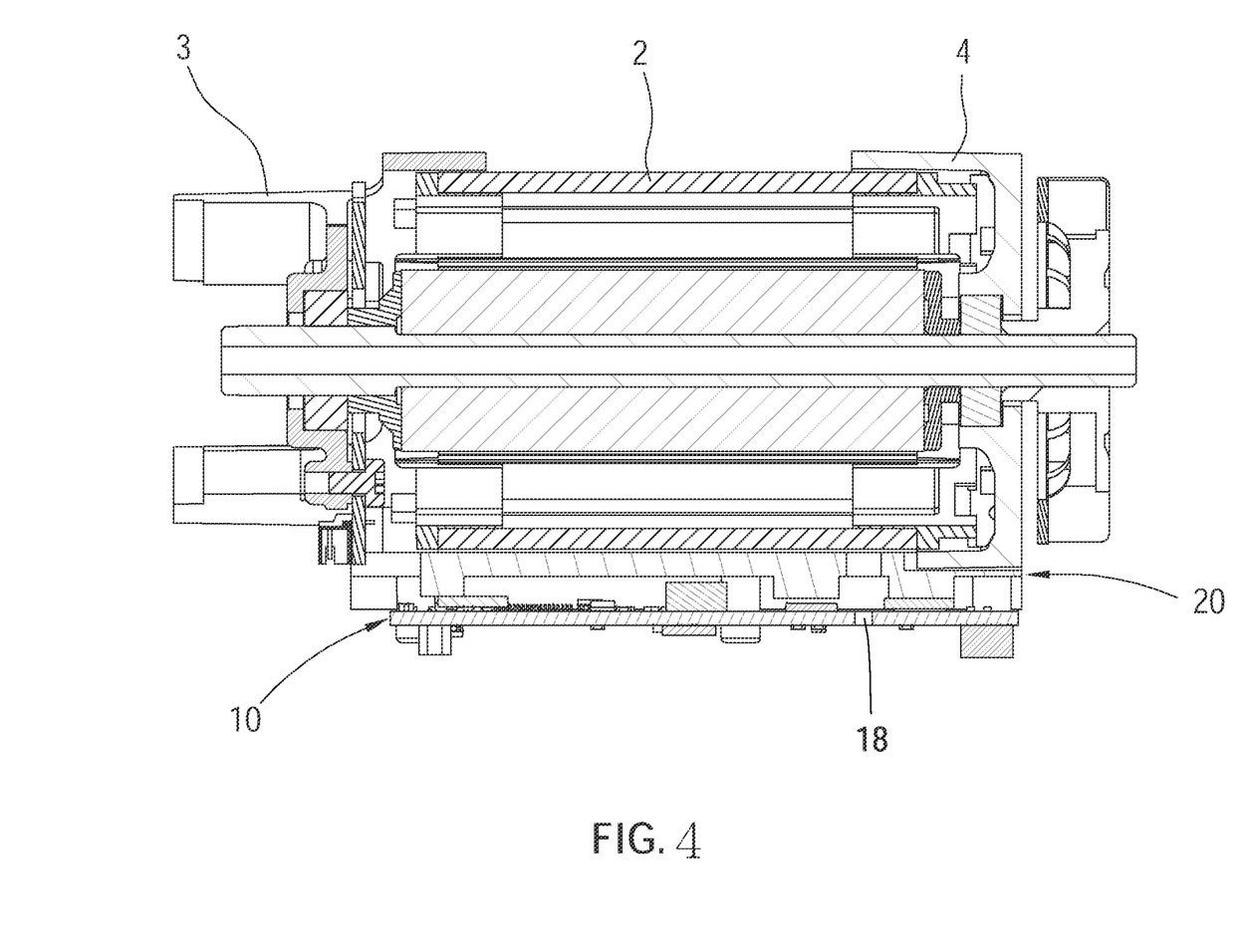
FIG. 4 is a cross-sectional view of the brushless motor assembly of FIG. 1 as viewed along line 4-4 of FIG. 1.

Furthermore, as shown in FIG. 2 and FIG. 3, the current embodiment includes a plurality of power switches 14, and the circuit board 10 has a plurality of solder holes 18 located between the power switches 14. The heat sink 20 includes a slot 22 which directly faces the solder holes 18 in a radial direction of the stator core 2. Slot 22 allows the first side portion 20a to communicate with the second side portion 20b, wherein the slot 22 provides a path for an external wire to be connected to the motor control unit 12 and the power switch 14 on the mounting surface 10a of the circuit board 10. For example, in an embodiment, one end of a three-phase wire could be inserted into a space enclosed by the heat sink 20 and the circuit board 10 via the slot 22 to be electrically connected to the motor control unit 12 or the power switch 14 on the mounting surface 10a of the circuit board 10 via the solder holes 18, while another end of the three-phase wire could be connected to the motor body 1 or a power supply unit of the electric tool 7 (e.g. a battery). In addition, in other applications, the three-phase wire is not a limitation of the present invention, and other types of wires could be utilized depending on the types of the applied motor or electric tool.

In addition, the heat sink 20 includes two lateral fences 24 which respectively protrude from two opposite edges of the second side portion 20b in a direction toward the circuit board 10, wherein the two lateral fences 24 are adapted to shield the mounting surface 10a of the circuit board 10. More specifically, the two lateral fences 24 surround and shield a periphery of the mounting surface 10a of the circuit board 10, thereby providing a good protection for the electronic components on the mounting surface 10a of the circuit board 10.

In addition, at least one heat dissipation pad 30 is further disposed between the heat sink 20 and the circuit board 10. In the current embodiment, two heat dissipation pads 30 are provided. The heat dissipation pads 30 are heat conductive and contact the heat sink 20, the mounting surface 10a of the circuit board 10, and/or the electronic components (such as the motor control unit 12, the power switch 14, or other components, etc.) on the mounting surface 10a. With the aforementioned design, it is favorable to improve heat dissipation of the electronic components.

Furthermore, the heat sink 20 is formed with at least one protruded part 26 on the second side portion 20b. In the current embodiment, three protruded parts 26 are formed on the second side portion 20b, wherein two of the protruded parts 26 are disposed adjacent to two sides of the slot 22, while the other protruded part 26 is disposed adjacent to another side edge of the heat sink 20. Preferably, the protruded parts 26 are provided on the front and rear side edges of the mounting surface 10a of the circuit board 10, thereby providing good shielding and protection effects. For explanation purpose, the aforementioned front and rear side edges are referred to the front end (e.g., the front cover 3) and the rear end (e.g., the rear cover 4) of the motor body 1, however, this is not a limitation of the present invention. In other applications, the front and rear side edges also could be referred to a left end or a right end.

Preferably, the circuit board 10 is detachably coupled to the heat sink 20, while the heat sink 20 is detachably coupled to the motor body 1. For example, in the current embodiment, the circuit board 10 includes a plurality of positioning holes 16, and the heat sink 20 is provided with a plurality of first positioning holes 28 and a plurality of second positioning holes 29 on the second side portion 20b. The circuit board 10 and the heat sink 20 are engaged with each other through some of bolts S connecting between the positioning holes 16 and the first positioning holes 28 in a detachable manner, while the heat sink 20 and the motor body 1 are engaged with each other by connecting the second positioning holes 29 of the heat sink 20 to the front cover 3 and the rear cover 4 of the motor body 1 through others of the bolts S in a detachable manner With the aforementioned design, the circuit board 10, the heat sink 20 and the motor body 1 could be flexibly combined and disassembled, thereby facilitating production assembly and disassembly for a maintenance process.

Figure 5:
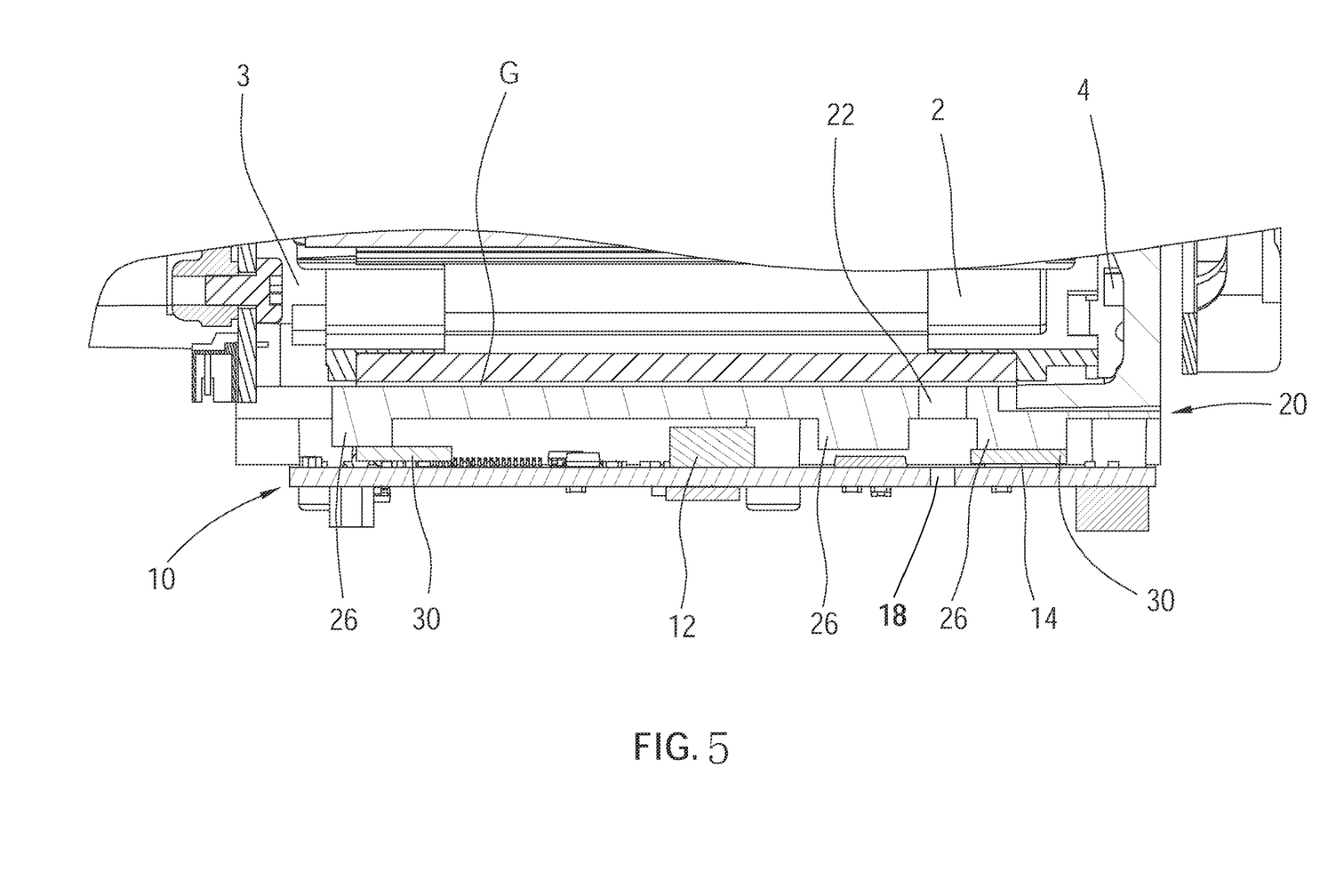
FIG. 5 is a partial enlarged view of the brushless motor assembly of FIG. 4.

Further referring to FIG. 5 and FIG. 6, when the fan 6 runs, the air flow brought by it could pass through the gap G between the heat sink 20 and the stator core 2, whereby to remove the heat energy of the heat sink 20 and the stator core 2, which provides good heat dissipation effect. Hence, it is favorable to dissipate heat from the motor control unit 12 and the power switch 14 on the circuit board 10. In addition, by using the heat sink 20 as a support for fixing the circuit board 10 to the motor body 1, it could effectively utilize an assembly space of the motor. Meanwhile, by shielding or enclosing the mounting surface 10a of the circuit board 10 with the heat sink 20, it could further isolate and protect the electronic components on the protection circuit board 10.

It must be pointed out that the embodiments described above are only some embodiments of the present invention. All equivalent structures which employ the concepts disclosed in this specification and the appended claims should fall within the scope of the present invention.

What is claimed is:

1. A brushless motor assembly, comprising:
    a motor body comprising a stator core, a front cover, and a rear cover, wherein the front cover and the rear cover are disposed at two opposite ends of the stator core in an axial direction of the stator core;
    a circuit board having a mounting surface and a plurality of solder holes, and including a motor control unit and at least two power switches, wherein the motor control unit and the at least two power switches are both disposed on the mounting surface, wherein the motor control unit is configured to control an operation of the at least two power switches; and
    a heat sink disposed between the motor body and the circuit board, wherein the heat sink has a first side portion and a second side portion, and the first side portion and the second side portion face opposite directions; the first side portion faces the motor body, and the second side portion faces the circuit board and shields the mounting surface of the circuit board;
    wherein the mounting surface of the circuit board faces the second side portion of the heat sink; the heat sink is connected to both the front cover and the rear cover, and is located on a side of the stator core in a radial direction of the stator core, and is spaced apart from the stator core with a gap; the heat sink has a slot allowing the first side portion to communicate with the second side portion; the second side portion of the heat sink is formed with at least two protruded parts located on two sides of the slot, wherein the plurality of solder holes directly face the slot, and the at least two protruded parts directly face the at least two power switches.

2. The brushless motor assembly of claim 1, wherein the heat sink includes two lateral fences, the second side portion of the heat sink has two opposite edges, and the two lateral fences protrude respectively from the two opposite edges of the second side portion in a direction toward the circuit board; the two lateral fences are configured to shield the mounting surface of the circuit board.

3. The brushless motor assembly of claim 1, further comprising at least one heat dissipation pad disposed between the circuit board and the heat sink.

4. The brushless motor assembly of claim 3, wherein the at least one heat dissipation pad contacts at least one of the at least two protruded parts.

5. The brushless motor assembly of claim 1, wherein the circuit board is detachably coupled to the heat sink.

6. The brushless motor assembly of claim 5, wherein the heat sink is detachably coupled to the motor body.

\* \* \* \* \*